United States Patent
Nagasue et al.

(10) Patent No.: US 9,071,216 B2
(45) Date of Patent: Jun. 30, 2015

(54) SIGNAL PROCESSING DEVICE AND SIGNAL PROCESSING METHOD

(75) Inventors: Makoto Nagasue, Tokyo (JP); Naotaka Saito, Tokyo (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 820 days.

(21) Appl. No.: 12/926,946

(22) Filed: Dec. 20, 2010

(65) Prior Publication Data

US 2011/0153046 A1 Jun. 23, 2011

(30) Foreign Application Priority Data

Dec. 21, 2009 (JP) ................................ 2009-289121

(51) Int. Cl.
*G06F 17/00* (2006.01)
*H03G 3/30* (2006.01)
*H03G 3/00* (2006.01)
*H04R 3/00* (2006.01)

(52) U.S. Cl.
CPC ............. *H03G 3/3005* (2013.01); *H03G 3/001* (2013.01); *H03G 3/3089* (2013.01)

(58) Field of Classification Search
USPC ................................................ 381/121, 120
See application file for complete search history.

(56) References Cited

U.S. PATENT DOCUMENTS

| | | | | |
|---|---|---|---|---|
| 5,677,962 A | * | 10/1997 | Harrison et al. | 381/109 |
| 5,841,385 A | * | 11/1998 | Xie | 341/139 |
| 2003/0012391 A1 | * | 1/2003 | Armstrong et al. | 381/312 |
| 2006/0089813 A1 | * | 4/2006 | Mushirahad et al. | 702/39 |
| 2006/0210096 A1 | * | 9/2006 | Stokes et al. | 381/107 |
| 2010/0277240 A1 | * | 11/2010 | Qiu et al. | 330/278 |

FOREIGN PATENT DOCUMENTS

JP       2009-273045 A    11/2009

* cited by examiner

*Primary Examiner* — Curtis Kuntz
*Assistant Examiner* — Thomas Maung
(74) *Attorney, Agent, or Firm* — Rabin & Berdo, P.C.

(57) ABSTRACT

A signal processing device includes a first amplifier, a converter, a signal processor, a controller, and a second amplifier. The first amplifier amplifies a level of an externally input analog audio signal with a first gain whose value is variable. The converter converts the analog audio signal amplified by the first amplifier into a digital audio signal. The signal processor that performs tone control signal processing on the digital audio signal. The controller detects a level of the digital audio signal before the signal processing and controls the value of the first gain in accordance with the detected level. The second amplifier detects a level of the digital audio signal after the signal processing and amplifies the digital audio signal after the signal processing with a second gain determined in accordance with the detected level and the first gain whose value has been controlled by the controller.

14 Claims, 3 Drawing Sheets

SIGNAL PROCESSING DEVICE AND SIGNAL PROCESSING METHOD

CROSS-REFERENCE TO RELATED APPLICATION

This application claims priority under 35 USC 119 from Japanese Patent Application No. 2009-289121 filed on Dec. 21, 2009, the disclosure of which is incorporated by reference herein.

BACKGROUND OF THE INVENTION

1. Field of the Invention

The present invention relates to a signal processing device and a signal processing method that automatically control a level of an input signal.

2. Related Art

In digital video cameras and digital still cameras, a device (hereinafter, referred to as a signal processing device) for converting input analog audio signals into digital signals, controlling tones and the like is provided at an input path for recording of motion picture sounds.

For example, a signal processing device disclosed in Japanese Patent Application Laid Open (JP-A) No. 2009-273045 is known. FIG. 3 is a view showing an exemplary configuration of a signal processor 10 described in JP-A No. 2009-273045. The signal processor 10 includes an input terminal 12, an analog signal processing block 14, a digital signal processing block 16, an auto level controller (ALC) 18, a level difference detector 20, a correction gain device 22, and an output terminal 24.

An analog audio signal input to the input terminal 12 through an unillustrated microphone is input to the analog signal processing block 14. The analog signal processing block 14 includes a programmable gain amplifier (PGA) 32 serving as an input amplifier and an analog-to-digital converter (ADC) 34. The analog audio signal input to the analog signal processing block 14 is first amplified by the PGA 32 and then converted into a digital signal by the ADC 34, and the digital signal is input to the subsequent digital signal processing block 16.

The PGA 32 is an externally programmable amplifier, the gain of which can be set to an arbitrary value. The gain of the PGA 32 is set to a value in accordance with a control signal given from the ALC 18, and the PGA 32 amplifies the input analog audio signal with the gain thus set.

The digital audio signal into which the analog audio signal is converted by the ADC 34 is input to the digital signal processing block 16. The digital signal processing block 16 includes a decimation filter 36, a DC-cut high pass filter (hereinafter, referred to as a DC-cut HPF) 38, and a tone control filtering section 40.

The decimation filter 36 performs decimation of the digital audio signal input from the ADC 34 and outputs the digital audio signal with a reduced sampling rate to the DC-cut HPF 38. In response to the receiving of the decimated digital audio signal, the DC-cut HPF 38 cuts out superfluous DC components generated by digital conversion in the ADC 34.

The ALC 18 is provided subsequent to the DC-cut HPF 38. The ALC 18 detects a level (magnitude of a sound, i.e., amplitude thereof) of the digital audio signal input from the DC-cut HPF 38 and sets the gain of the PGA 32 on the basis of the detected level so that the analog audio signal input to the PGA 32 can be amplified to a constant level. The input audio level is thereby automatically controlled to a constant level. The ALC 18 is a control circuit for detecting the level of the digital audio signal and outputting a control signal to the PGA 32 and outputs the input digital audio signal to the subsequent tone control filtering section 40 and the level difference detector 20 without performing processing on the input digital audio signal.

The tone control filtering section 40 performs filtering for tone control. The tone control filtering section 40 includes a wind noise removal high pass filter (HPF) 42 and a notch filter 44. The wind noise removal HPF 42 removes a low-frequency wind noise component which is input through the microphone. This filter is used with a predetermined cut-off frequency (e.g., about 100 to 200 Hz). After removing the wind noise, the notch filter 44 removes noise of a specific frequency which occurs depending on the equipment in which this device is included.

The digital audio signal, the tone of which is controlled by the tone control filtering section 40 is input to the level difference detector 20 and the correction gain device 22 which are provided at the stage subsequent thereto.

The digital audio signal before being filtered by the tone control filtering section 40 and the digital audio signal after being filtered by the tone control filtering section 40 are input to the level difference detector 20. The level difference detector 20 detects the difference in the level between the two input digital audio signals and outputs the detected difference to the correction gain device 22 as a correction gain value.

The tone-controlled digital audio signal from the notch filter 44 and the correction gain value from the level difference detector 20 are input to the correction gain device 22. The correction gain device 22 amplifies the input digital audio signal in accordance with the input correction gain value so that the digital audio signal has a predetermined constant level. After the level, correction by the correction gain device 22, the resultant digital audio signal is output as recorded data from the output terminal 24.

The signal processor shown in FIG. 3 can always obtain an output of constant level and prevent a reduction in sound volume due to cut-off of low-frequency sound or the like since the level attenuated by the tone control filtering section 40 (the wind noise removal HPF 42 and the notch filter 44) is compensated for by the correction gain device 22.

However, since the level control is performed only in the analog area having a wide dynamic range (having a large difference between a large sound and a small sound), in some cases, control for obtaining a desired sound may be difficult depending on the type of input sound signal. Specific discussion thereon will be provided below.

Supposing there is an occurrence of very loud sound, it is preferable to set a target level of sound in the PGA 32 to a low level (e.g., −4 dBFS or the like) to some extent in advance, and also to set a decay rate (a rate of gradually increasing the gain in accordance with a decrease in the level of the audio signal after the gain is reduced) to be low to some extent. This is because if the target level is set relatively low, since the gain is controlled so that the level of the input analog audio signal may start decreasing at the point in time when the level of the input analog audio signal exceeds the target level, it is possible to suppress frequent occurrence of saturation due to belated gain reduction at the start of the very loud sound. Further, by setting the decay rate to be low, the gain would not easily increase, thereby reducing the frequency of saturation.

However, in any of above-mentioned case, the sound volume which is obtained as a result becomes relatively low on the whole.

Accordingly, in a device having the conventional configuration described above, it is difficult in some cases to increase the sound volume while suppressing saturation.

Further, the signal processor shown in FIG. 3 is configured so as to perform gain control based on the difference in envelopes before and after the tone control filtering section 40. Therefore, even if an input audio level is at a substantially silent level, a minute difference may occur due to the effect of a quantization error caused by the filtering operation in the tone control filtering section 40, and by detecting this minute difference, the signal processor may increase the gain too much and raise a floor noise level excessively.

SUMMARY

The present invention is proposed in consideration of the above situation, and is to provide a signal processing device and a signal processing method which can amplify audio signals of various levels to favorable levels and output the resultant audio signals.

An aspect of the present invention is a signal processing device that includes: a first amplifier that amplifies a level of an analog audio signal input from external with a first gain whose value is variable; a converter that converts the analog audio signal amplified by the first amplifier into a digital audio signal; a signal processor that performs signal processing for controlling tone on the digital audio signal; a controller that detects a level of the digital audio signal before the signal processing and controls the value of the first gain in accordance with the detected level of the digital audio signal before the signal processing; and a second amplifier that detects a level of the digital audio signal after the signal processing and amplifies the digital audio signal after the signal processing with a second gain determined in accordance with the detected level of the digital audio signal after the signal processing and the first gain whose value has been controlled by the controller.

With this configuration, since input signal can be amplified by the first amplifier and then further by the second amplifier, even if the first amplifier cannot sufficiently amplify the level of the input signal, the second amplifier can amplify the level thereof, and therefore a digital audio signal which is amplified to a favorable level can be obtained. More specifically, for example, in order to prevent saturation due to an input of very loud sound, the target level of amplification in the first amplifier is set to be low. Therefore, even if the first amplifier cannot sufficiently amplify the level of the input signal, the second amplifier amplifies the level thereof, and an output of favorable level can be achieved. The second gain of the second amplifier is a gain in accordance with the detected level and the first gain. For example, when the first gain is small and the level amplified by the first amplifier is not sufficient, the second gain is set to be large. When the first gain is large and the level amplified by the first amplifier is sufficient, the second gain is set to be small. Thus, the second gain can be flexibly set in accordance with the first gain. As a result, a digital audio signal amplified to a favorable level can be output.

In the above aspect of the present invention, the controller may control the value of the first gain to a predetermined level as a target of amplification, in accordance with the detected level of the digital audio signal before the signal processing.

In the above aspect of the present invention, the second amplifier may amplify the digital audio signal after the signal processing with the second gain that is determined in accordance with the detected level of the digital audio signal after the signal processing, and whose value is equal to or less than a value obtained by subtracting the first gain set for the first amplifier from a predetermined gain.

Due to this configuration, an excessive increase of the second gain can be prevented, and thereby excessive amplification at a substantially silent level can be prevented.

In the above aspect of the present invention, the controller may perform a first decay operation for increasing the first gain in accordance with a decrease in the detected level of the digital audio signal before the signal processing after the first gain is reduced, and the second amplifier may perform a second decay operation for increasing the second gain in accordance with a decrease in the detected level of the digital audio signal after the signal processing after the second gain is reduced and may stop performing the second decay operation while the controller performs the first decay operation.

If the first decay operation and the second decay operation are performed at the same time, for example, the output of the second amplifier may become unstable. However, since the second decay operation is stopped while the first is performed, the occurrence of the above unstable condition can be prevented.

Another aspect of the present invention is a signal processing method including: amplifying, by a first amplifier, a level of an analog audio signal input from external with a first gain whose value is variable; converting, by a converter, the analog audio signal amplified by the first amplifier into a digital audio signal; performing, by a signal processor, signal processing for controlling tone on the digital audio signal; detecting, by a controller, a level of the digital audio signal before the signal processing and controlling, by the controller, the value of the first gain in accordance with the detected level of the digital audio signal before the signal processing; and detecting, by a second amplifier, a level of the digital audio signal after the signal processing and amplifying, by the second amplifier, the digital audio signal after the signal processing with a second gain determined in accordance with the detected level of the digital audio signal after the signal processing and the first gain whose value which has been controlled by the controller.

Thus, as described above, according to the above aspects, audio signals of various levels can be amplified to favorable levels and output.

BRIEF DESCRIPTION OF THE DRAWINGS

Exemplary embodiments of the present invention will be described in detail based on the following figures, wherein.

DETAILED DESCRIPTION

Hereinafter, exemplary embodiments of the present invention will be discussed in detail with reference to figures.

The First Exemplary Embodiment

Figure 1:
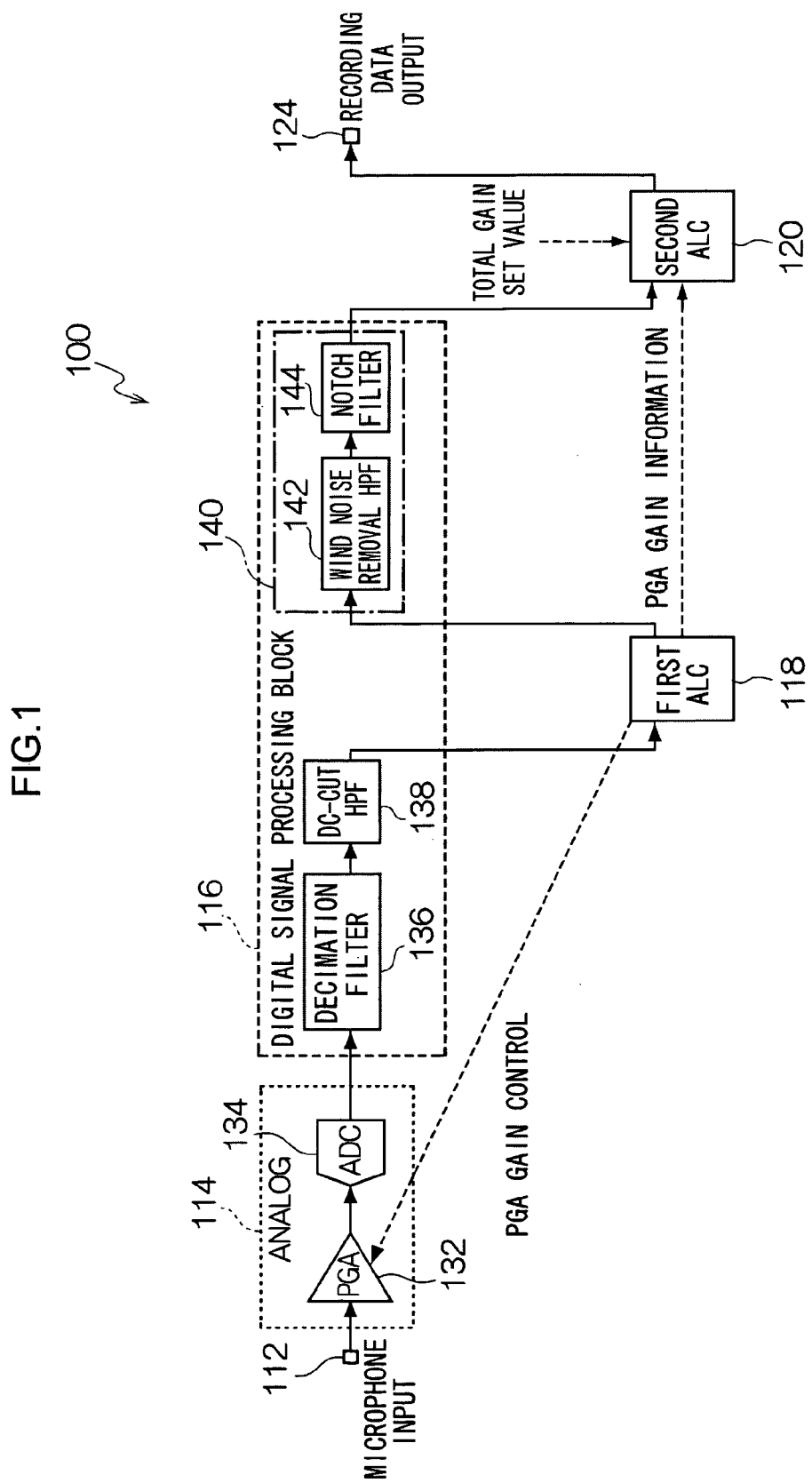
FIG. 1 is a view showing an exemplary configuration of a signal processor in accordance with a first exemplary embodiment.

FIG. 1 is a view showing an exemplary configuration of a signal processor 100 in accordance with the first exemplary embodiment. The signal processor 100 of the first exemplary embodiment is provided in a recording path used for recording an input sound and includes an input terminal 112, an analog signal processing block 114, a digital signal processing block 116, a first auto level controller (ALC) 118, a second ALC 120, and an output terminal 124.

An analog audio signal input to the input terminal 112 through, a not-shown microphone is input to the analog signal processing block 114. The analog signal processing block 114 includes a programmable gain amplifier (PGA) 132 serving as an input amplifier and an analog-to-digital converter (ADC) 134. The analog audio signal input to the analog signal processing block 114 is first amplified by the PGA 32, then converted into a digital signal by the ADC 134, and the digital signal is input to the digital signal processing block 116 at the stage subsequent thereto.

The PGA 132 is an externally programmable amplifier, the gain of which can be set to an arbitrary value. The gain of the PGA 132 is set to a value in accordance with a control signal given from the first ALC 118, and the PGA 132 amplifies the input analog audio signal with the gain thus set. In the first exemplary embodiment, a sigma-delta-type (ΣΔ) ADC is applied as the ADC 134. The sigma-delta-type ADC 134 outputs a digital audio signal at a low-bit and high-sampling rate such as 1-bit and 128 Fs (×128 sampling rate).

The digital audio signal into which the analog audio signal is converted by the ADC 134 is input to the digital signal processing block 116. The digital signal processing block 116 includes a decimation filter 136, a DC-cut high pass filter (hereinafter, referred to as a DC-cut HPF) 138, and a tone control filtering section 140.

The decimation filter 136 performs decimation to the digital audio signal input from the ADC 134 and outputs the digital audio signal with reduced sampling rate to the DC-cut HPF 138. As described above, since the digital audio signal of low-bit and high-sampling rate is input from the sigma-delta-type ADC 134, first, the decimation filter 136 performs decimation on the signal to reduce (decimate/thinning) its sampling rate. In response to the receiving of the decimated digital audio signal, the DC-cut HPF 138 cuts out superfluous DC components generated by digital conversion in the ADC 134.

The first ALC 118 is provided subsequent to the DC-cut HPF 138. The first ALC 118 detects a level (magnitude of the amplitude) of the digital audio signal input from the DC-cut HPF 138 and sets (controls) the gain of the PGA 132 (hereinafter, referred to as a PGA gain) to be used for amplifying the analog audio signal input to the PGA 132 to a predetermined level (hereinafter, referred to as a first target level) as the target of amplification, on the basis of the detected level. However, if the level of the analog audio signal is made constant without limitation, the inflection is lost in the sound and there is some unpleasantness in auditory feeling. Therefore, in the first exemplary embodiment, a Max gain (upper limit value) is set to impose some limitations. The first ALC 118 is a control circuit for detecting the level of the digital audio signal and outputting a control signal to the PGA 132, and therefore outputs the input digital audio signal to the tone control filtering section 140 at the stage subsequent thereto without performing processing on the input digital audio signal.

The first ALC 118 further gives information indicating a current PGA gain set in the PGA 132 (hereinafter, referred to as PGA gain information) to the second ALC 120 described later.

The tone control filtering section 140 performs filtering for tone control. The tone control filtering section 140 includes a wind noise removal high pass filter (HPF) 142 and a notch filter 144. The wind noise removal HPF 142 removes a low-frequency wind noise component which is input through the microphone. This filter is used with a predetermined cut-off frequency (e.g., about 100 to 200 Hz). After removing the wind noise, the notch filter 144 removes noise of a specific frequency which occurs depending on the equipment in which this device is included.

The digital audio signal, the tone of which is controlled by the tone control filtering section 140 is input to the second ALC 120 provided at the stage subsequent thereto. The PGA gain information is also input to the second ALC 120 from the first ALC 118. The second ALC 120 detects a level of the digital audio signal input from the tone control filtering section 140, determines a gain (hereinafter, referred to as an ALC gain) to be used for amplifying the analog audio signal input to the PGA 132 to a predetermined level (hereinafter, referred to as a second target level) as the target of amplification, on the basis of the detected level and the PGA gain information given by the first ALC 118, and amplifies the input digital audio signal with the ALC gain. The digital audio signal amplified by the second ALC 120 is output (as recorded data) from the output terminal 124.

Here, the ALC gain will be described. The second ALC 120 first obtains a gain α to be used for bringing the detected level of the analog audio signal into the second target level. Then, the gain α is adjusted in accordance with the magnitude of the PGA gain indicated by the PGA gain information given by the first ALC 118 and the adjusted gain β is used as the ALC gain.

In the above adjustment, when the PGA gain is larger than a predetermined magnitude (value), for example, the ALC gain is reduced in accordance with the magnitude of the PGA gain so that the ALC gain would not be too large. More specifically, for example, a gain β obtained by subtracting the product of the PGA gain and a coefficient from the above-obtained gain α may be used as the ALC gain. Alternatively, the PGA gain and an adjustment value can be stored in a matrix table and the gain β obtained by subtracting the adjustment value stored in the matrix table from the gain α may be used as the ALC gain.

Further, as shown in FIG. 1, adjustment may be made so that a total value (total gain) of the PGA gain and the ALC gain does not exceed (i.e., is equal to or less than) a predetermined set value (total gain set value). Specifically, the ALC gain may be adjusted so as to be equal to or less than a value obtained by subtracting the PGA gain from the total gain set value. The total gain set value can be set in the second ALC 120 in advance. The total gain set value may be used as the aforementioned Max gain of the PGA gain.

Here, description will be made on a specific example of the control on the PGA gain and the ALC gain. For example, when the level of the low frequency region of the input signal is small and the level of the digital audio signal detected by the first ALC 118 is small, since the PGA gain is set to be relatively large, the ALC gain to be used in the second ALC 120 will be small. However, when the level of the low frequency region of the input signal is large and the level of the digital audio signal detected by the first ALC 118 is large, the PGA gain becomes relatively small and does not increase up to the Max gain. Then, the digital audio signal of small level with its low frequency region cut by the tone control filtering section 140 is input to the second ALC 120. In this case, since the PGA gain controlled by the first ALC 118 is relatively small having sufficiently residual up to the total gain set value, the ALC gain can be considerably raised through the total gain control by the second ALC 120 and the level of the amplified digital audio signal consequently becomes large.

In other words, in the signal processor having the configuration of the first exemplary embodiment, in addition to the level adjustment by the first ALC 118, the level readjustment can be further performed by the second ALC 120, and therefore, audio signals of various levels can be amplified to desired levels and output.

The effect of the first exemplary embodiment will be described in more detail as compared with that of the conventional art.

Figure 3:
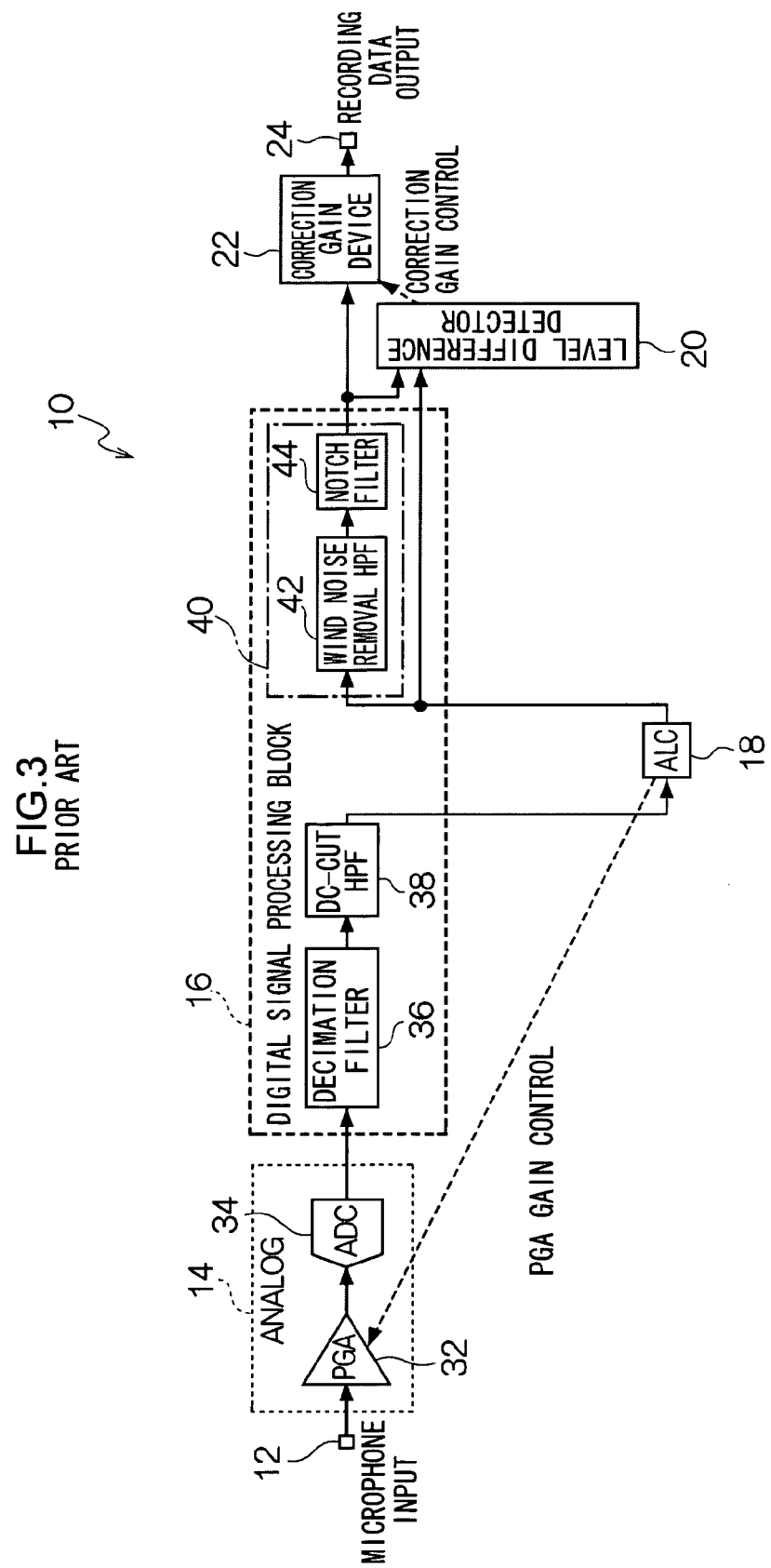
FIG. 3 is a view showing an exemplary configuration of a signal processor in accordance with the conventional art.

In the conventional signal processor having the configuration shown in FIG. 3, the correction gain device 22 is provided to perform a correction of raising the level by a decrease of the level caused by the tone control filtering section 40 in accordance with the detected difference and, therefore, it is difficult to increase the sound volume while suppressing saturation.

In the first exemplary embodiment, however, the first target level of the amplification by the PGA 132 and the second target level of the amplification by the second ALC 120 are individually set and amplification can be performed respectively. Therefore, it is possible to perform level control with higher flexibility such that, for example, the first target level in the first ALC 118 may be set lower than the second target level in order to prevent saturation and the second target level in the second ALC 120 may be set higher than the first target level.

Further, since the first ALC 118 gives the PGA gain information to the second ALC 120, the second ALC 120 can obtain the ALC gain to be used for amplification so as to be equal to or less than the total gain set value in accordance with the level of the digital audio signal which has been processed by the tone control filtering section 140 and the given PGA gain information. Therefore, it is also possible to suppress an excessive increase of the ALC gain at a substantially silent level.

The Second Exemplary Embodiment

Figure 2:
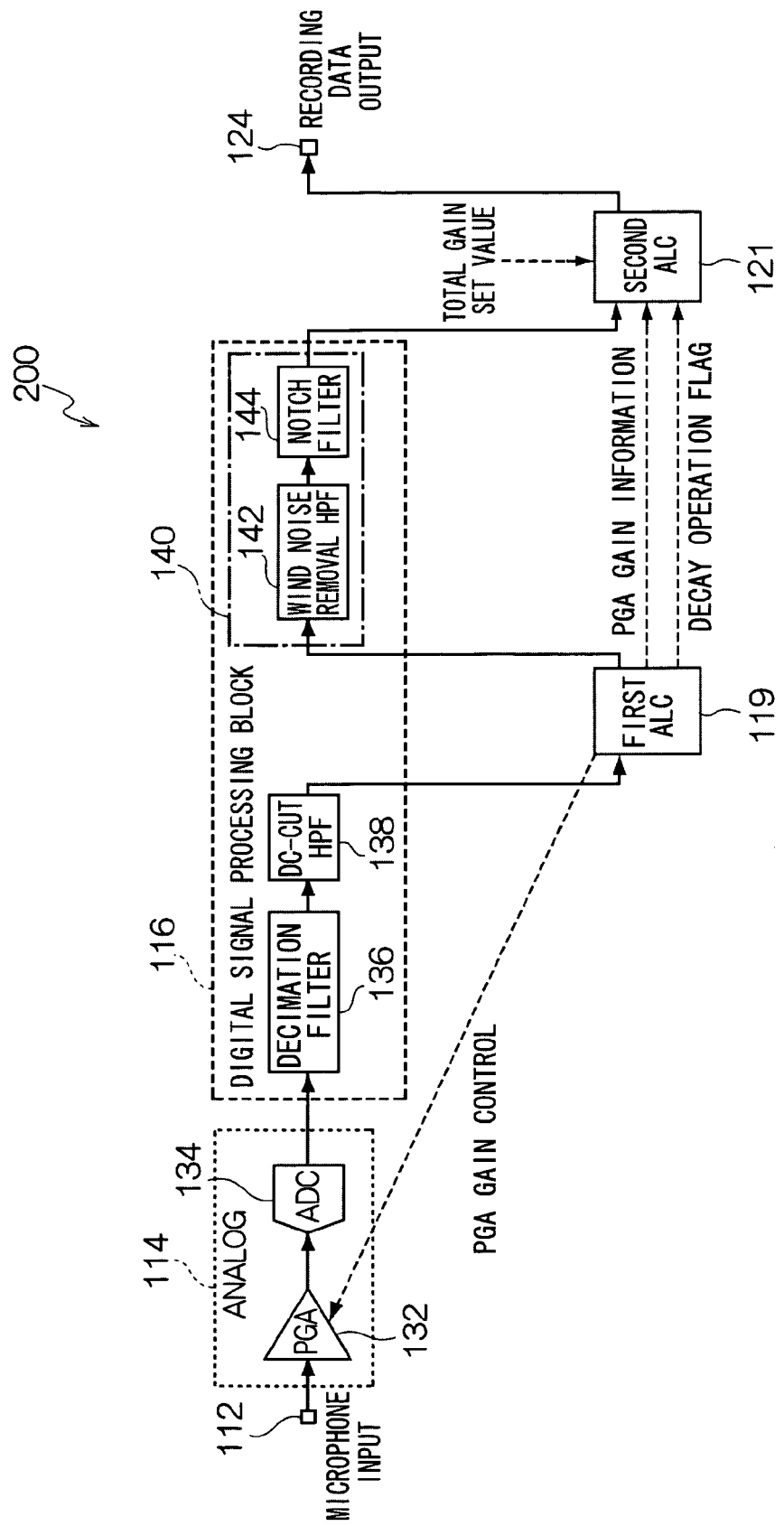
FIG. 2 is a view showing an exemplary configuration of a signal processor in accordance with a second exemplary embodiment.

FIG. 2 is a view showing an exemplary configuration of a signal processor 200 in accordance with the second exemplary embodiment. Components in FIG. 2 having the same reference signs as those in FIG. 1 have the same functions as those in FIG. 1, and therefore descriptions thereof will be omitted.

In the second exemplary embodiment, a first ALC 119 is provided subsequent to the DC-cut HPF 138. Similar to the first ALC 118 in the first exemplary embodiment, the first ALC 119 detects a level of the digital audio signal input from the DC-cut HPF 138 and sets (controls) the PGA gain to achieve the predetermined first target level as a target on the basis of the detected level and also gives the PGA gain information to a second ALC 121.

Further, when the first ALC 119 detects the digital audio signal having a large level which would exceed the first target level if it is amplified with the set PGA gain, the first ALC 119 reduces the PGA gain so that the digital audio signal may be the first target level and then performs a decay operation for gradually increasing the PGA gain in accordance with the decrease of the level of the audio signal. With this decay operation, the digital audio signal converges to the first target level. Hereinafter, this decay operation is referred to as a first decay operation. During the first decay operation, the first ALC 119 sets a flag (decay operation flag) indicating that the first decay operation is performed, to thereby notify the second ALC 121 that the first decay operation is performed. Basically, the first ALC 119 inputs a signal of high (H) level to the second ALC 121 as the decay operation flag while the first decay operation is performed and otherwise inputs a signal of low (L) level to the second ALC 121.

The tone control filtering section 140 is provided subsequent to the first ALC 119. The digital audio signal which is tone-controlled by the tone control filtering section 140 is input to the second ALC 121 provided at the stage further subsequent thereto. The PGA gain information and the decay operation flag are also input to the second ALC 121 from the first ALC 119.

The second ALC 121 detects a level of the digital audio signal input from the tone control filtering section 140, obtains the ALC gain to achieve the predetermined second target level as a target on the basis of the detected level and the PGA gain information given by the first ALC 119, and amplifies the input digital audio signal with the ALC gain. The method of obtaining the ALC gain is the same as that described in the first exemplary embodiment and description thereof will be omitted.

When the second ALC 121 detects the digital audio signal having a large level which would exceed the second target level if it is amplified with the set ALC gain, the second ALC 121 reduces the ALC gain so that the digital audio signal may be the second target level and then also performs a decay operation for gradually increasing the ALC gain in accordance with the decrease in the level of the audio signal. With this decay operation, the digital audio signal converges to the second target level. Hereinafter, this decay operation is referred to as second decay operation. In the second exemplary embodiment, the second ALC 121 stops the second decay operation while the decay operation flag is H level (in other words, while the above-described first decay operation is performed). In other words, the second ALC 121 does not perform the second decay operation while the first decay operation is performed.

Hereinafter, description will be made on a problem caused by performing the first decay operation and the second decay operation at the same time.

As an example, a case is taken in which after an analog audio signal of large level is input and the PGA gain and the ALC gain are reduced, the PGA gain and the ALC gain are increased by the first and second decay operations in accordance with the decrease in the detected level of the digital audio signal.

If the second decay operation is performed regardless of the first decay operation, the gains start to increase and continue to rise up to the respective target levels both in the first and second decay operations. Although the case in which there is a large difference (in condition of ALC1<ALC2) between the first target level and the second target level is regarded as an exception, when both of the levels are set almost the same, an output of the later-stage second ALC 121 which is affected by both of the gain increases reaches the second target level earlier. After that, since an output of the first ALC 119 has not yet reached the first target level, the PGA gain continues to increase and the output level of the later-stage second ALC 121 further increases and will exceed the second target level. Then, since the output of the second ALC 121 exceeds the second target level, decrease in the gain occurs. If the above operation continues, the final output of the second ALC 121 repeats rise and drop alternately around the second target level, and oscillation in the amplitude of the output will be caused. Thus, performing the first decay operation and the second decay operation at the same time may cause the output level unstable.

In the second exemplary embodiment, however, since the second decay operation (raising the ALC gain) is stopped while the first decay operation (raising the PGA gain) is performed, it is possible to resolve such an unstable operation as described above.

The foregoing description of the exemplary embodiment of the present invention has been provided for the purpose of illustration and description. It is not intended to be exhaustive or to limit the invention to the precise form disclosed herein. Obviously, many modifications and variations will be apparent to a practitioner skilled in the art. The exemplary embodiments were chosen and described in order to explain the principles of the invention and its practical applications, thereby enabling others skilled in the art to understand the invention according to various embodiments and with various modifications as are suited to the particular use contemplated. It is intended that the scope of the invention be defined by the following claims and their equivalents.

What is claimed is:

1. A signal processing device comprising:
    a first amplifier that amplifies a level of an analog audio signal input from an external source with a first gain whose value is variable;
    a converter that converts the analog audio signal amplified by the first amplifier into a digital audio signal;
    a signal processor that performs signal processing for controlling tone of the digital audio signal, the signal processor including means for attenuating a low-frequency region of the digital audio signal;
    a controller that detects a level of the digital audio signal before the signal processing and controls the value of the first gain in accordance with the detected level of the digital audio signal before the signal processing; and
    a second amplifier that detects a level of the digital audio signal after the signal processing, determines a second gain in accordance with the detected level of the digital audio signal after the signal processing and the first gain, and amplifies the digital audio signal after the signal processing with the second gain,
    wherein the first gain applied to the first amplifier is set to be small if the level of the digital audio signal in the low-frequency region is large and the second gain determined by the second amplifier is set to be large,
    wherein the controller performs a first decay operation for increasing the first gain in accordance with a decrease in the detected level of the digital audio signal before the signal processing after the first gain is reduced, and
    wherein the second amplifier performs a second decay operation for increasing the second gain in accordance with a decrease in the detected level of the digital audio signal after the signal processing after the second gain is reduced and stops performing the second decay operation while the controller performs the first decay operation.

2. The signal processing device according to claim 1, wherein
    the controller controls the value of the first gain to a predetermined level as a target of amplification, in accordance with the detected level of the digital audio signal before the signal processing.

3. The signal processing device according to claim 1, wherein
    the second amplifier amplifies the digital audio signal after the signal processing with the second gain that is determined in accordance with the detected level of the digital audio signal after the signal processing, and whose value is equal to or less than a value obtained by subtracting the first gain set for the first amplifier from a predetermined gain.

4. A signal processing method comprising:
    amplifying, by a first amplifier, a level of an analog audio signal input from an external source with a first gain whose value is variable;
    converting, by a converter, the analog audio signal amplified by the first amplifier into a digital audio signal;
    performing, by a signal processor, signal processing for controlling tone of the digital audio signal, the signal processing including attenuating a low-frequency region of the digital audio signal;
    detecting, by a controller, a level of the digital audio signal before the signal processing and controlling, by the controller, the value of the first gain in accordance with the detected level of the digital audio signal before the signal processing; and
    detecting, by a second amplifier, a level of the digital audio signal after the signal processing;
    determining, by the second amplifier, a second gain in accordance with the detected level of the digital audio signal after the signal processing and the first gain; and
    amplifying, by the second amplifier, the digital audio signal after the signal processing with the second gain,
    wherein the first gain applied to the first amplifier is set to be small if the level of the digital audio signal in the low-frequency region is large and the second gain determined by the second amplifier is set to be large,
    wherein the controller performs a first decay operation for increasing the first gain in accordance with a decrease in the detected level of the digital audio signal before the signal processing after the first gain is reduced, and
    wherein the second amplifier performs a second decay operation for increasing the second gain in accordance with a decrease in the detected level of the digital audio signal after the signal processing after the second gain is reduced and stops performing the second decay operation while the controller performs the first decay operation.

5. The signal processing device according to claim 1, wherein the controller provides information indicating the first gain set at the first amplifier to the second amplifier.

6. The signal processing device according to claim 1, wherein the signal processor is disposed downstream of the converter and upstream of the second amplifier.

7. The signal processing method according to claim 4, further comprising inputting, by the controller, information indicating the first gain set at the first amplifier to the second amplifier.

8. The signal processing device according to claim 1, wherein the second amplifier determines the second gain by obtaining gain $\alpha$ based on the detected level of the digital audio signal after the signal processing and a target level of the digital audio signal, and obtaining the second gain by adjusting gain $\alpha$ based on the first gain.

9. The signal processing device according to claim 1, wherein, if the second gain that has been determined in accordance with the detected level of the digital audio signal after the signal processing exceeds a difference between a predetermined gain and the first gain, the second amplifier adjusts the second gain by subtracting a predetermined value from the determined second gain so that the second gain after adjustment does not exceed the difference between the predetermined gain and the first gain.

10. The signal processing method according to claim 4, wherein the determining of the second gain by the second amplifier includes obtaining gain $\alpha$ based on the detected level of the digital audio signal after the signal processing and a target level of the digital audio signal, and obtaining the second gain by adjusting gain $\alpha$ based on the first gain.

11. The signal processing method according to claim 4, further comprising, if the second gain that has been determined in accordance with the detected level of the digital audio signal after the signal processing exceeds a difference between a predetermined gain and the first gain, adjusting, by the second amplifier, the second gain by subtracting a predetermined value from the determined second gain so that the second gain after adjustment does not exceed the difference between the predetermined gain and the first gain.

12. A signal processing device comprising:
- a first amplifier that amplifies a level of an analog audio signal input from an external source with a first gain whose value is variable;
- a converter that converts the analog audio signal amplified by the first amplifier into a digital audio signal;
- a signal processor that performs signal processing for controlling tone of the digital audio signal;
- a controller that detects a level of the digital audio signal before the signal processing and controls the value of the first gain in accordance with the detected level of the digital audio signal before the signal processing; and
- a second amplifier that detects a level of the digital audio signal after the signal processing, determines a second gain in accordance with the detected level of the digital audio signal after the signal processing and the first gain, and amplifies the digital audio signal after the signal processing with the second gain, wherein the second amplifier generates an output signal for audio equipment that is not included in the signal processing device itself, wherein the controller performs a first decay operation for increasing the first gain in accordance with a decrease in the detected level of the digital audio signal before the signal processing after the first gain is reduced, and wherein the second amplifier performs a second decay operation for increasing the second gain in accordance with a decrease in the detected level of the digital audio signal after the signal processing after the second gain is reduced and stops performing the second decay operation while the controller performs the first decay operation.

13. The signal processing device according to claim 12, wherein the audio equipment is recording equipment.

14. The signal processing device according to claim 12, wherein the controller that detects the level of the digital audio signal passes information indicating the first gain to the second amplifier.

\* \* \* \* \*